(12) United States Patent
Fan et al.

(10) Patent No.: US 11,112,636 B2
(45) Date of Patent: Sep. 7, 2021

(54) DISPLAY DEVICE

(71) Applicant: Innolux Corporation, Miao-Li County (TW)

(72) Inventors: Chia-Chieh Fan, Miao-Li County (TW); Tong-Jung Wang, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 17/029,069

(22) Filed: Sep. 23, 2020

(65) Prior Publication Data
US 2021/0109389 A1    Apr. 15, 2021

(30) Foreign Application Priority Data
Oct. 9, 2019   (CN) .......................... 201910955786.5

(51) Int. Cl.
*G02F 1/1333*   (2006.01)
*G02F 1/1335*   (2006.01)
*G02F 1/1345*   (2006.01)
*G02F 1/1362*   (2006.01)
(Continued)

(52) U.S. Cl.
CPC ........ *G02F 1/13336* (2013.01); *G02F 1/1345* (2013.01); *G02F 1/1362* (2013.01); *G02F 1/133512* (2013.01); *G02F 1/133514* (2013.01); *G02F 1/133528* (2013.01);
(Continued)

(58) Field of Classification Search
CPC ..... H01H 2219/036; F21K 9/66; F21V 5/004; H01L 33/62; H01L 27/153; H01L 31/143; H01L 23/4985; H01L 27/156; G02F 1/133512; G02F 1/133528; G02F 1/133514; G02F 1/13336; G02F 1/133603; G02F 2001/133388; G02F 2001/136222; G02F 1/1362; G02F 1/1345
See application file for complete search history.

(56) References Cited

U.S. PATENT DOCUMENTS 7,091,927 B1    8/2006  Hagge et al.
2018/0173036 A1*  6/2018  Kim ..................... G02F 1/13336
(Continued)

FOREIGN PATENT DOCUMENTS

CN   104464557   3/2015

*Primary Examiner* — Mariam Qureshi
(74) *Attorney, Agent, or Firm* — JCIPRNET (57) ABSTRACT

A display device including a liquid crystal display, light-emitting diode boards, a system board, and a flexible circuit board is provided. The plurality of light-emitting diode boards are disposed adjacent to the liquid crystal display and overlaps a peripheral region of the liquid crystal display in a normal direction of the display device. At least one of the light-emitting diode boards includes a carrier, light-emitting diodes, and connecting pads. The carrier has a first surface and a second surface opposite to the first surface and located between the first surface and the liquid crystal display. The light-emitting diodes are disposed on the first surface. The connecting pads are disposed on the second surface and are electrically connected to the light-emitting diodes. The system board is located below and electrically connected to the liquid crystal display. The system board is electrically connected to the connecting pads through the flexible circuit board.

20 Claims, 7 Drawing Sheets

(51) Int. Cl.
 *H01L 27/15* (2006.01)
 *H01L 33/62* (2010.01)
(52) U.S. Cl.
 CPC ............ *H01L 27/156* (2013.01); *H01L 33/62* (2013.01); *G02F 1/136222* (2021.01)

(56) References Cited

U.S. PATENT DOCUMENTS

2018/0217465 A1* 8/2018 Nagata .............. G02F 1/133514
2020/0057323 A1* 2/2020 Son ......................... G02F 1/163

* cited by examiner

DISPLAY DEVICE

CROSS-REFERENCE TO RELATED APPLICATION

This application claims the priority benefit of Chinese patent application serial no. 201910955786.5, filed on Oct. 9, 2019. The entirety of the above-mentioned patent application is hereby incorporated by reference herein and made a part of this specification.

BACKGROUND

Technical Field

The disclosure relates to an electronic device, and in particular relates to a display device.

Description of Related Art

Currently, a television wall is formed by tiling a plurality of displays (such as a liquid crystal display or a light-emitting diode display), but there are issues such as a wider bezel near the junction place, which affects the overall display quality of the television wall, or relatively higher costs.

SUMMARY

The disclosure provides a display device, which improves the aforementioned problem of bezel widths or costs.

According to the embodiments of the disclosure, the display device includes a liquid crystal display, a plurality of light-emitting diode boards, a system board, and a flexible circuit board. The liquid crystal display includes a peripheral region. The plurality of light-emitting diode boards are disposed adjacent to the liquid crystal display and overlaps the peripheral region of the liquid crystal display in a normal direction of the display device. At least one of the plurality of light-emitting diode boards includes a carrier, a plurality of light-emitting diodes, and a plurality of connecting pads. The carrier has a first surface and a second surface. The second surface is opposite to the first surface, and the second surface is located between the first surface and the liquid crystal display. The plurality of light-emitting diodes are disposed on the first surface. The plurality of connecting pads are disposed on the second surface and are electrically connected to the plurality of light-emitting diodes. The system board is located below the liquid crystal display and is electrically connected to the liquid crystal display, and the system board is electrically connected to the plurality of connecting pads through the flexible circuit board.

Based on the foregoing, in the embodiments of the disclosure, by tiling the liquid crystal display and the plurality of light-emitting diode boards into the display device, a quantity of light-emitting diodes and/or the circuit boards required can be reduced, which reduces costs of the display device. Alternatively, by disposing the plurality of light-emitting diode boards in the peripheral region of the liquid crystal display, and by providing images through the plurality of light-emitting diode boards, the bezel width near the junction place can be effectively reduced, thereby improving the display quality of the display device.

To make the aforementioned features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

The disclosure may be understood with reference to the following detailed description and the accompanying drawings. It should be noted that, for ease of understanding by readers and conciseness of the drawings, a plurality of drawings in the disclosure merely show a part of an electronic device/display device, and specific elements in the drawings are not drawn to scale. In the accompanying drawings, each of the drawings depicts typical features of methods, structures, and/or materials used in the particular exemplary embodiments. However, these drawings are not to be interpreted as defining or limiting the scope or nature of these embodiments. For example, a relative dimension, thickness, and position of each film layer, region, and/or structure may be reduced or enlarged for the sake of clarity.

Some terms are used to refer to specific elements throughout the whole specification and the appended claims in the disclosure. A person skilled in the art should understand that an electronic device manufacturer may use different names to refer to the same elements. This specification is not intended to distinguish elements that have the same functions but different names. In this specification and the claims, terms such as "include", "comprise", and "have' are open-ended terms, and should be interpreted as "including, but not limited to".

The directional terms mentioned herein, like "above", "below", "front", "back', "left", "right", and the like, refer only to the directions in the accompanying drawings. Therefore, the directional terms are used for explaining instead of limiting the disclosure. It should be understood that when an element or film layer is referred to as being disposed "on", or "connected to" another element or film layer, the element or film layer may be directly on or connected to said another element or film layer, or intervening elements or film layers may also be present (non-direct circumstances). In contrast, when an element or film layer is referred to as being "directly on" or "directly connected to" another element, no intervening elements or film layers are present.

The term "about", "equal to", "equal", "substantial", or "same" mentioned herein typically represents a value is in a range within 20% of a given value, or a range within 10%, 5%, 3%, 2%, 1%, or 0.5% of a given value.

In the following embodiments, identical or similar reference numerals will be used to refer to identical or similar elements, and repeated description thereof will be omitted. In addition, the features in the different exemplary embodiments may be used in combination with each other without departing from or conflicting with the spirit of the disclosure, and simple equivalent variations and modifications made in accordance with this specification or the claims are still within the scope of the disclosure. Moreover, "first", "second", and similar terms mentioned in the specification or the claims are merely used to name discrete elements or to differentiate among different embodiments or ranges. Therefore, the terms should not be regarded as limiting an upper limit or a lower limit of the quantity of the elements and should not be used to limit the manufacturing sequence or arrangement sequence of elements.

Figure 1:
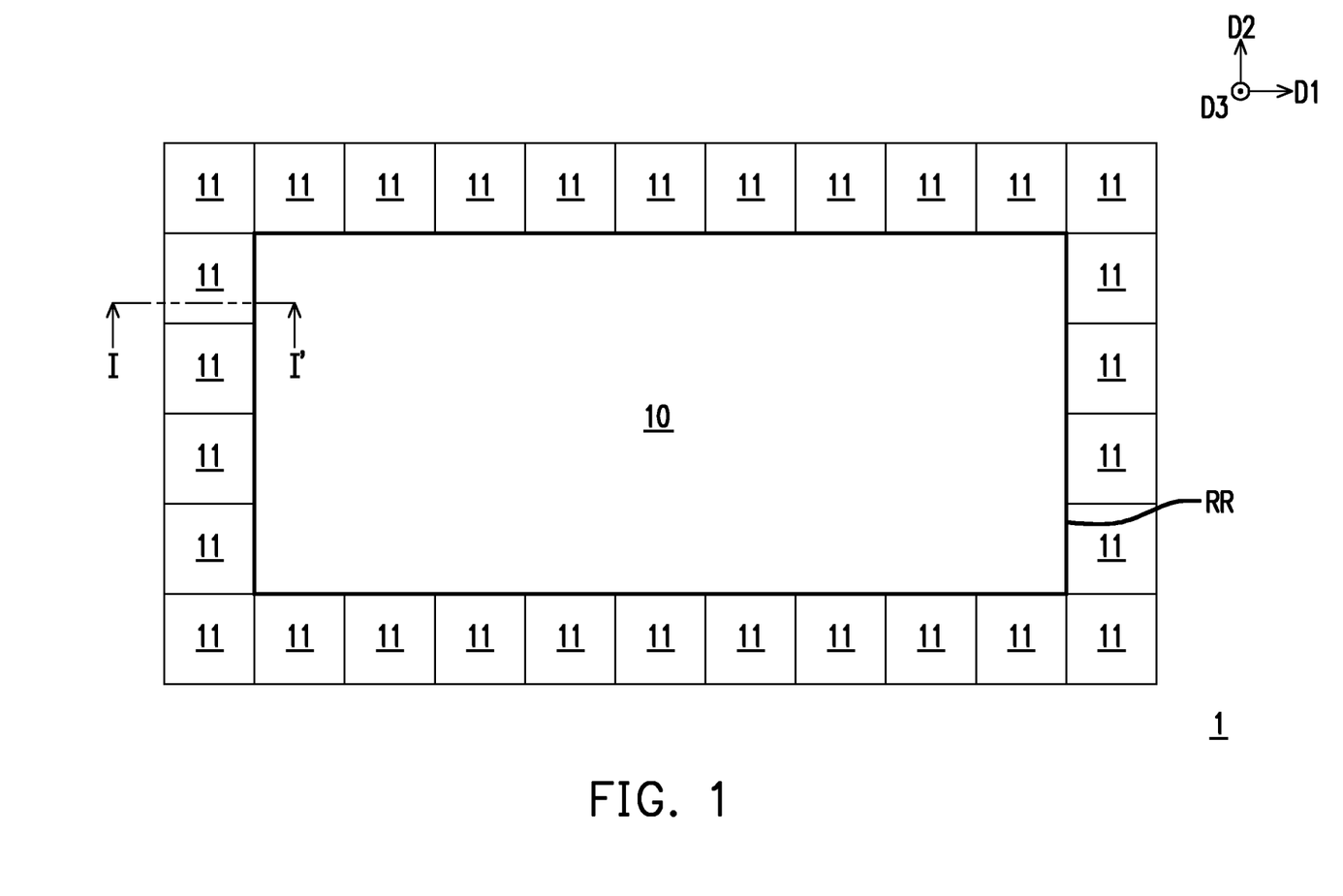
FIG. 1 is a schematic top view of a display device according to the first embodiment of the disclosure.
Figure 2:
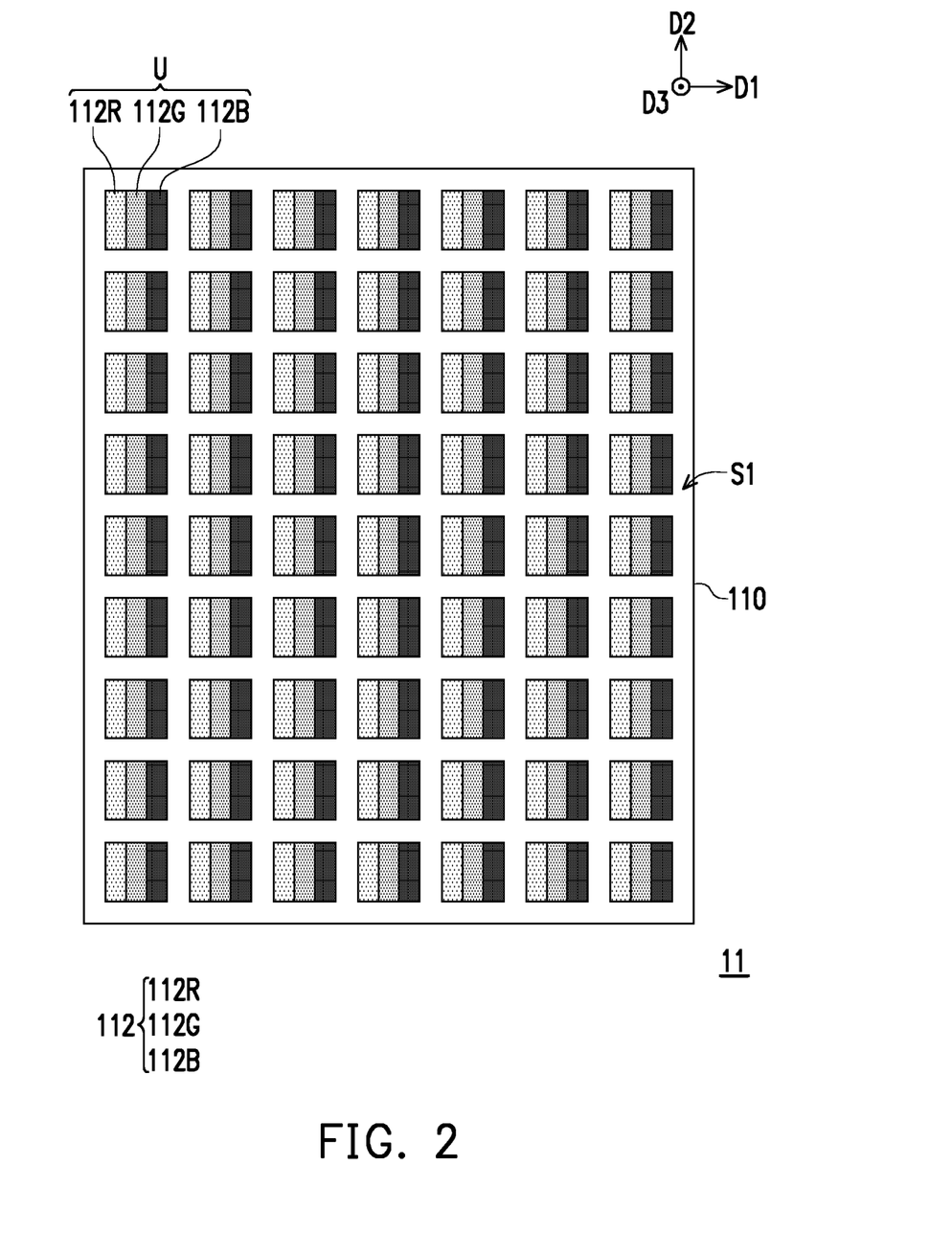
FIG. 2 is a schematic top view of a light-emitting diode board in FIG. 1.
Figure 3:
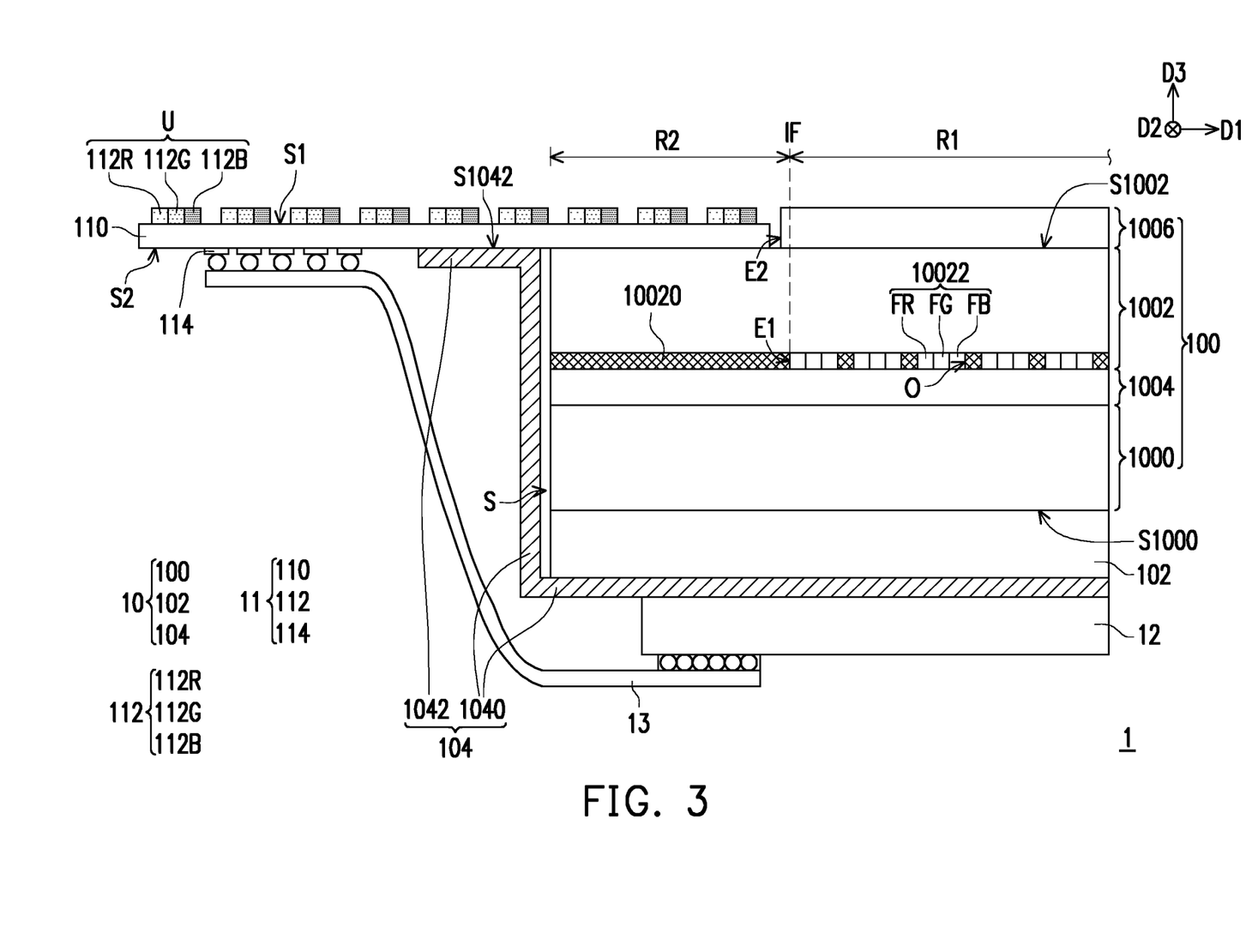
FIG. 3 is a schematic cross-sectional view along a line I-I' in FIG. 1.

FIG. 1 is a schematic top view of a display device 1 according to the first embodiment of the disclosure. FIG. 2 is a schematic top view of a light-emitting diode board 11 in FIG. 1. FIG. 3 is a schematic cross-sectional view along a line I-I' in FIG. 1. Referring to FIG. 1 to FIG. 3, the display device 1 includes a liquid crystal display 10, a plurality of light-emitting diode boards 11, a system board 12, and a flexible circuit board 13.

The liquid crystal display 10 may be any kind of liquid crystal display, such as a twisted nematic liquid crystal display, a vertical alignment liquid crystal display, an in-plane switching liquid crystal display, or a fringe field switching liquid crystal display, but is not limited thereto.

As shown in FIG. 3, the liquid crystal display 10 may include a liquid crystal display module 100, a light source module 102, and a backplane 104. The light source module 102 is located between the liquid crystal display module 100 and the backplane 104. However, the specific configuration of the liquid crystal display 10 may be modified depending on requirements, and is not limited thereto.

The liquid crystal display module 100 may include an active element array substrate 1000, an opposite substrate 1002, a liquid crystal layer 1004, an upper polarizing plate 1006, and a lower polarizing plate (not shown). However, the specific configuration of the liquid crystal display module 100 may be modified depending on requirements, and is not limited thereto.

The active element array substrate 1000 may include a substrate (not shown), an active element array (not shown) disposed on the substrate, and peripheral circuits (not shown). For further clarity of the drawings, the active element array substrate 1000 is illustrated as flat-shaped. A reference may be made to known literature for relevant descriptions of the active element array substrate, and no further limitations/descriptions are provided herein.

The opposite substrate 1002 overlaps the active element array substrate 1000 in a normal direction D3 of the display device 1 (or a normal direction of the opposite substrate 1002). The opposite substrate 1002 may include a light shielding structure 10020 and color filter structures 10022. However, the specific configuration of the opposite substrate 1002 may be modified depending on requirements, and is not limited thereto.

The light shielding structure 10020 is adapted to shield elements located therebelow. For example, the light shielding structure 10020 may include opaque materials, light-absorbing materials, light-reflecting materials, or a combination thereof, but is not limited thereto. In an embodiment, the light shielding structure 10020 may include black resin, a metal material, or a combination thereof, but is not limited thereto.

The light shielding structure 10020 has a plurality of openings O which allow light to pass through. The plurality of color filter structures 10022 are disposed in the plurality of openings O and are corresponding to a plurality of pixel regions (not shown) of the active element array substrate 1000. For example, a color filter structure 10022 may include a plurality of light filters. The plurality of light filters may, for example, include at least a red light filter FR, at least a green light filter FG, and at least a blue light filter FB. The red light filter FR is adapted to allow the red light to pass through. The green light filter FG is adapted to allow the green light to pass through. The blue light filter FB is adapted to allow the blue light to pass through. The red light filter FR, the green light filter FG, and the blue light filter FB may be sequentially arranged along a first direction D1, and a plurality of light filters of the same color may be arranged along a second direction D2. However, the kinds of colors and the arrangement in the color filter structures 10022 may be modified depending on requirements, and are not limited thereto. In an embodiment, the color filter structures 10022 may also be formed on the active element array substrate 1000. In this manner, it is possible that the opposite substrate 1002 does not include the color filter structures 10022.

The liquid crystal layer 1004 is located between the active element array substrate 1000 and the opposite substrate 1002. A plurality of liquid crystal molecules (not shown) in the liquid crystal layer 1004 may alter tilt directions according to an electric field of the active element array substrate 1000 and/or the opposite substrate 1002, thereby controlling polarization of light. Types of the plurality of liquid crystal molecules in the liquid crystal layer 1004 are not limited. For example, the liquid crystal molecules may be twisted nematic liquid crystal molecules, vertical alignment liquid crystal molecules, in-plane switching liquid crystal molecules, or fringe field switching liquid crystal molecules, but are not limited thereto.

The upper polarizing plate 1006 is disposed on an outer surface S1002 of the opposite substrate 1002. The lower polarizing plate (not shown) is disposed on an outer surface S1000 of the active element array substrate 1000. The active element array substrate 1000, the opposite substrate 1002, and the liquid crystal layer 1004 are located between the upper polarizing plate 1006 and the lower polarizing plate. The upper polarizing plate 1006 and the lower polarizing plate may respectively have a transmission axis, and the two transmission axes are perpendicular or parallel to each other.

The light source module 102 at least partially overlaps the liquid crystal display module 100 in the normal direction D3 of the display device 1 (or the normal direction of the opposite substrate 1002). For example, the light source module 102 may be located between the liquid crystal display module 100 and the backplane 104. A reference may be made to known literature for relevant descriptions of the light source module 102, and no further limitations/descriptions are provided herein.

The backplane 104 is adapted to carry elements and/or provide heat dissipation effects. For example, materials of the backplane 104 may include glass or metals, but are not limited thereto. The backplane 104 has a central portion 1040 and a peripheral portion 1042 which is connected to the central portion 1040. A space S is formed in the central portion 1040, and the liquid crystal display module 100 and the light source module 102 are disposed in the space. In this embodiment, as shown in FIG. 3, at least part of the liquid crystal display module 100 and the light source module 102 are located in the space S. The outer surface S1002 of the opposite substrate 1002 is substantially flush with a carrying surface 51042 of the peripheral portion 1042 of the backplane 104. However, the disclosure is not limited thereto. For example, in some embodiments, the outer surface S1002 of the opposite substrate 1002 may also be higher than the carrying surface 51042 of the peripheral portion 1042.

The liquid crystal display 10 has an active region R1 and a peripheral region R2. The active region R1 is a region of the liquid crystal display 10 to display an image, the peripheral region R2 is a non-display region of the liquid crystal display 10, and a boundary IF is a boundary between the active region R1 and the peripheral region R2. The peripheral region R2 is located on a periphery of the active region R1, and wiring (not shown), circuits, or other elements may be disposed in the peripheral region R2. The abovementioned elements may be shielded by the light shielding structure 10020 located in the peripheral region R2.

In this embodiment, as shown in FIG. 3, the plurality of color filter structures 10022 may be disposed in the active region R1. The upper polarizing plate 1006 is disposed in the active region R1 and may further extend into the peripheral region R2 to overlap part of the peripheral region R2 in the normal direction D3 of the display device 1.

The plurality of light-emitting diode boards 11 are located on a periphery of the liquid crystal display 10 and overlaps the peripheral region R2 of the liquid crystal display 10 in the normal direction D3 of the display device 1. In this embodiment, as shown in FIG. 1, a plurality of light-emitting diode boards 11 surrounds the liquid crystal display 10, but a relative configuration between the plurality of light-emitting diode boards 11 and the liquid crystal display 10 is not limited thereto. For example, the plurality of light-emitting diode boards 11 may also be located on one side, two adjacent sides, two opposite sides, or three sides of the liquid crystal display 10.

As shown in FIG. 2 and FIG. 3, at least one of the plurality of light-emitting diode boards 11 may include a carrier 110, a plurality of light-emitting diodes 112, and a plurality of connecting pads 114. However, the disclosure is not limited thereto.

The carrier 110 may carry the plurality of light-emitting diodes 112 and the plurality of connecting pads 114, and the carrier 110 may have circuits (not shown) by which the plurality of light-emitting diodes 112 and the plurality of connecting pads 114 are electrically connected. However, the disclosure is not limited thereto. The carrier 110 is disposed corresponding to the liquid crystal display module 100 and the peripheral portion 1042, and the carrier 110 may contact the liquid crystal display module 100 and/or the peripheral portion 1042. In this embodiment, as shown in FIG. 3, the carrier 110 may be jointly supported by the liquid crystal display module 100 and the peripheral portion 1042. The carrier 110 may contact the peripheral portion 1042 of the backplane 104, and the carrier 110 may contact the opposite substrate 1002. In addition, the carrier 110 may be disposed adjacent to the upper polarizing plate 1006, for example, adjacent to an outer edge E2 of the upper polarizing plate 1006, but is not limited thereto. The carrier 110 may have certain stiffness. That is, a thickness of the carrier 110 may be, for example, 0.1 mm to 5.0 mm (0.1 mm≤thickness≤5.0 mm), but is not limited thereto. Thereby, a portion of the carrier 110 which is not supported by the liquid crystal display module 100 and the backplane 104 (such as the portion where the plurality of connecting pads 114 are disposed) can maintain flat-shaped substantially. For example, the carrier 110 may be a printed circuit board, an active element glass substrate, or a redistributed metal layer, but is not limited thereto.

The carrier 110 may have a first surface S1 and a second surface S2. The second surface S2 is opposite to the first surface S1, and the second surface S2 is located between the first surface S1 and the backplane 104. The plurality of light-emitting diodes 112 may be disposed on the first surface S1. For example, the light-emitting diode may include an organic light-emitting diode, a mini light-emitting diode, a micro light-emitting diode, or a quantum dot light-emitting diode (including, e.g., a QLED, and a QDLED), but is not limited thereto.

In this embodiment, the plurality of light-emitting diodes 112 include a plurality of red light-emitting diodes 112R, a plurality of green light-emitting diodes 112G, and a plurality of blue light-emitting diodes 112B. The red light-emitting diode 112R can emit red light. The green light-emitting diode 112G can emit green light. The blue light-emitting diode 112B can emit blue light. The red light-emitting diode 112R, the green light-emitting diode 112G, and the blue light-emitting diode 112B may be sequentially arranged along the first direction D1, and the light-emitting diodes of the same color may be arranged along the second direction D2. However, the disclosure is not limited thereto. In other embodiments, the plurality of light-emitting diodes 112 and the color filter structures 10022 have the same kinds of colors and/or the same manner of arrangement, thereby improving a display quality of the display device. The term "same kinds of colors" means that a wavelength range of a light emitted by the light-emitting diode 112 at least partially overlaps a wavelength range of a light which the light filter allows to pass through. For example, a wavelength range of the red light emitted by the red light-emitting diode 112R at least partially overlaps a wavelength range of the red light which the red light filter FR allows to pass through. The term "same manner of arrangement" means that a plurality of light filters of one color and a plurality of light-emitting diodes of the same color are arranged along the same direction and at the same interval. For example, the plurality of red light filters FR are arranged along the second direction D2 at an interval, and the plurality of red light-emitting diodes 112R are also arranged along the second direction D2 at substantially the same interval. The green light-emitting diodes 112G and the blue light-emitting diodes 112B are also arranged in this manner, and will not be repeatedly described herein. However, the kinds of colors and the manner of arrangement of the plurality of light-emitting diodes 112 may be modified depending on requirements and are not limited thereto.

The plurality of light-emitting diodes 112 of at least one of the plurality of light-emitting diode boards 11 may be arranged in an m*n array according to a pixel pitch of the liquid crystal display 10. Herein m or n is a common factor of a resolution of the liquid crystal display 10. In this manner, an integer quantity of the light-emitting diode boards 11 may be tiled on the periphery of liquid crystal display 10, and the plurality of light-emitting diodes 112 of the light-emitting diode boards 11 tiled on the periphery of the liquid crystal display 10 may be regarded as an extension of pixels of the liquid crystal display 10. It should be noted that m or n is counted by using a pixel unit U as a calculation unit. In this embodiment, the pixel unit U may be formed by sequentially arranging, along the first direction D1, one red light-emitting diode 112R, one adjacent green light-emitting diode 112G, and one adjacent blue light-emitting diode 112B. One pixel unit U of the liquid crystal display 10 may be formed by sequentially arranging, along the first direction D1, one red light filter FR, one adjacent green light filter FG, and one adjacent blue light filter FB. FIG. 2 schematically illustrates a 9*7 array in which m=9 and n=7. However, the quantity and/or the manner of arrangement of the pixel unit U of the light-emitting diode board 11 are not limited thereto.

When m≠n, the carrier 110 may be, for example, a rectangular carrier, as shown in FIG. 2. On the other hand, when m=n, the carrier 110 may be, for example, a square carrier. When m or n is too small, more of the light-emitting diode boards 11 and the flexible circuit boards 13 are required, which increases costs. On the other hand, when m or n is too large, more of the light-emitting diodes 112 are required, which also results in cost increasing. Therefore, m and n may be configured to be greater than or equal to 20, and less than or equal to 120 (20≤m≤120, 20≤n≤120). For example, a Full HD liquid crystal display 10 having a diagonal of 80 inches has a resolution of 1920*1080, and a pixel pitch of about 0.92 mm. The common factor m or n of the resolution may be, for example, a value of 2, 3, 4, 5, 10, 20, 40, 60 or 120. When m=n=20, for example, an area occupied by the plurality of light-emitting diodes 112 on the carrier 110 is about 18.44 mm*18.44 mm. Alternatively, when m=n=120, an area occupied by the plurality of light-emitting diodes 112 on the carrier 110 is about 110.7 mm*110.7 mm. The appropriate light-emitting diode board 11 may be devised by considering a quantity of the flexible circuit boards 13 required and the dimensions of the carrier 110. Therefore, m and n may be configured to be greater than or equal to 20, and less than or equal to 120.

The plurality of connecting pads 114 are disposed on the second surface S2 and are electrically connected to the plurality of light-emitting diodes 112. The system board 12 is located below the backplane 104 and is electrically connected to the light-emitting diode board 11. In other words, part of the backplane 104 is located between the system board 12 and the liquid crystal display module 100. The system board 12 is electrically connected to the plurality of connecting pads 114 by the flexible circuit board 13. And the flexible circuit board 13 may be disposed on a bottom surface (i.e., the second surface S2) of the carrier 110, and electrically connected to the plurality of light-emitting diodes 112 by the plurality of connecting pads 114, instead of being electrically connected to the first surface S1 through a side surface of the carrier 110 (e.g., on the left side of FIG. 3). Accordingly, a length of the flexible circuit board 13 can be shortened, which can reduce costs or reduce a bezel width needed for tiling. The system board 12 may be a control board of the liquid crystal display 10, or a control board of the liquid crystal display 10 and the plurality of light-emitting diode boards 11.

A surface-mount technology may be used to make the plurality of connecting pads 114 electrically connected to the flexible circuit board 13. For example, the plurality of connecting pads 114 do not overlap the backplane 104 and the liquid crystal display module 100 in the normal direction D3 of the display device 1, and it facilitates the bonding of the plurality of connecting pads 114 and the flexible circuit board 13. The surface-mount technology may include a ball grid array technology, a hot-melt fusion bonding, a technology of conductive particle lamination, or other suitable technologies, but is not limited thereto. Conductive particles may be solder balls, solder pastes, or conductive particles in an anisotropic conductive film, but are not limited thereto. In addition, the manner in which the system board 12 and the flexible circuit board 13 are bonded is not further limited. For example, the system board 12 and the flexible circuit board 13 may be bonded to each other through a connector or an anisotropic conductive film, but are not limited thereto.

By tiling the liquid crystal display 10 and the plurality of light-emitting diode boards 11 into the display device 1, the quantity of the light-emitting diode boards 11 and/or the flexible circuit board 13 required can be reduced, thereby facilitating a reduction of the costs of the display device 1. In addition, by disposing a plurality of light-emitting diode boards 11 in the peripheral region R2 of the liquid crystal display 10, and by providing images through the plurality of light-emitting diode boards 11, a bezel width near a junction place RR (referring to thick solid lines in FIG. 1) can be effectively reduced, thereby improving the display quality of the display device 1.

Figure 4:
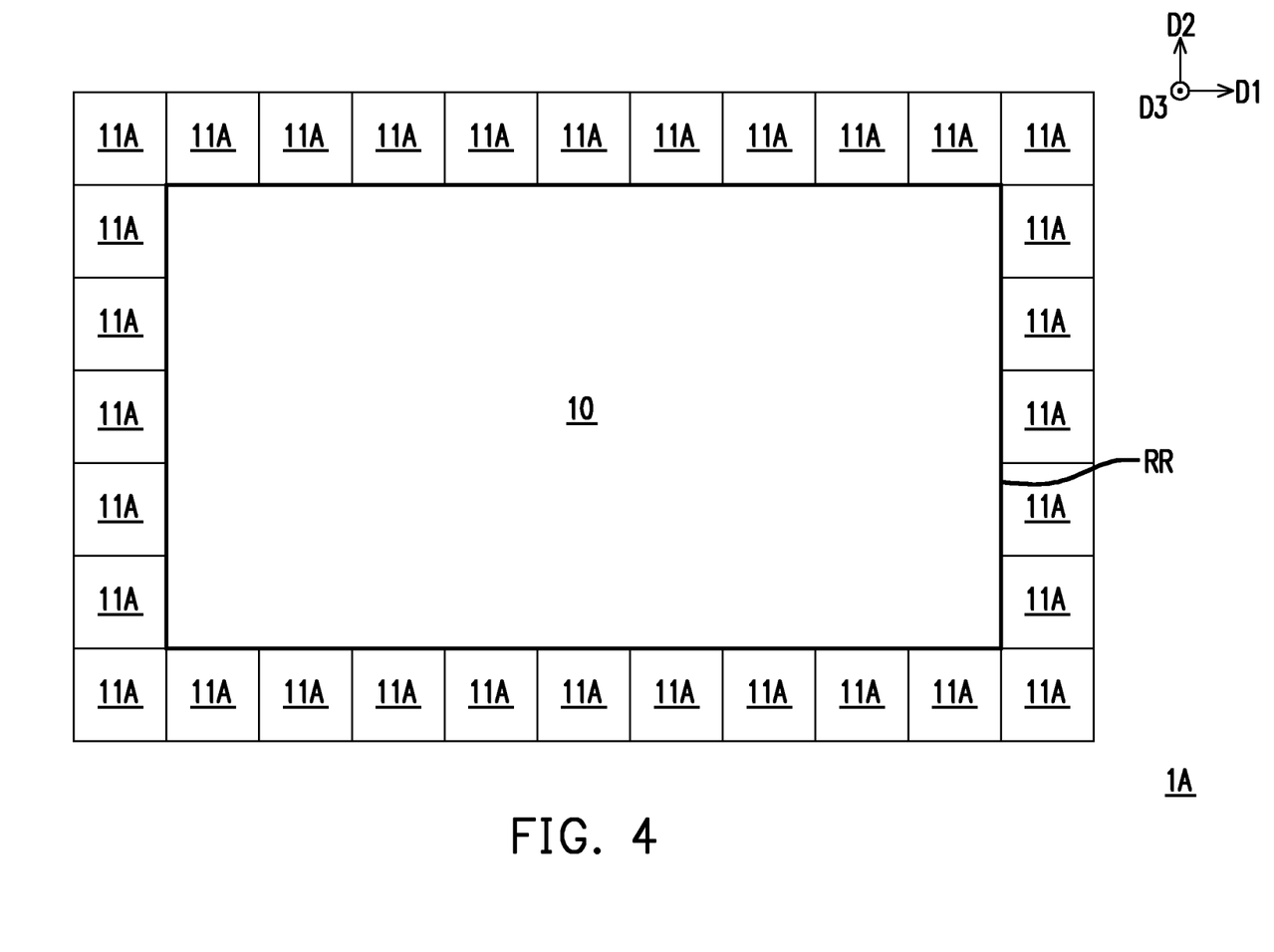
FIG. 4 is a schematic top view of a display device according to the second embodiment of the disclosure.
Figure 5:
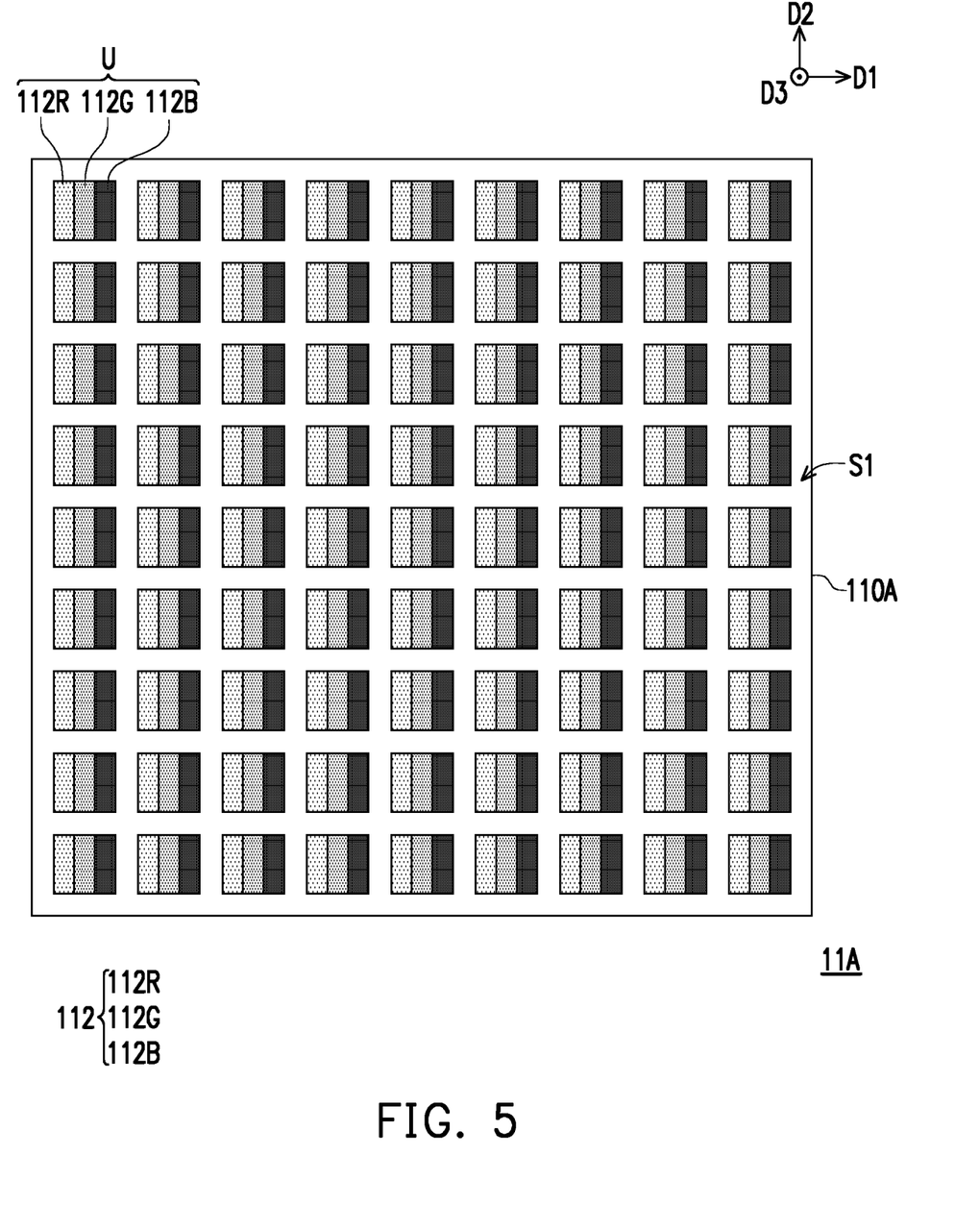
FIG. 5 is a schematic top view of a light-emitting diode board in FIG. 4.

FIG. 4 is a schematic top view of a display device 1A according to the second embodiment of the disclosure. FIG. 5 is a schematic top view of a light-emitting diode board 11A in FIG. 4. Referring to FIG. 4 and FIG. 5, a main difference between the display device 1A and the display device 1 of FIG. 1 is the designs of the light-emitting diode boards. In the light-emitting diode board 11A of the display device 1A, a carrier 110A is a square carrier, and a quantity of the light-emitting diodes 112 disposed on the carrier 110A along the first direction D1 is the same as a quantity of the light-emitting diodes 112 disposed on the carrier 110A along the second direction D2. For example, the light-emitting diodes 112 on the carrier 110A are arranged in an m*n array, and herein m=n=9. However, quantities of m and n may be modified depending on requirements, and are not limited thereto. In an embodiment, m and n may be configured to be greater than or equal to 20, and less than or equal to 120. The design of the square carrier increases the degree of freedom of tiling, decreases the tiling difficulty, or improves the tiling efficiency when the light-emitting diode board 11A and the liquid crystal display 10 are tiled.

Figure 6:
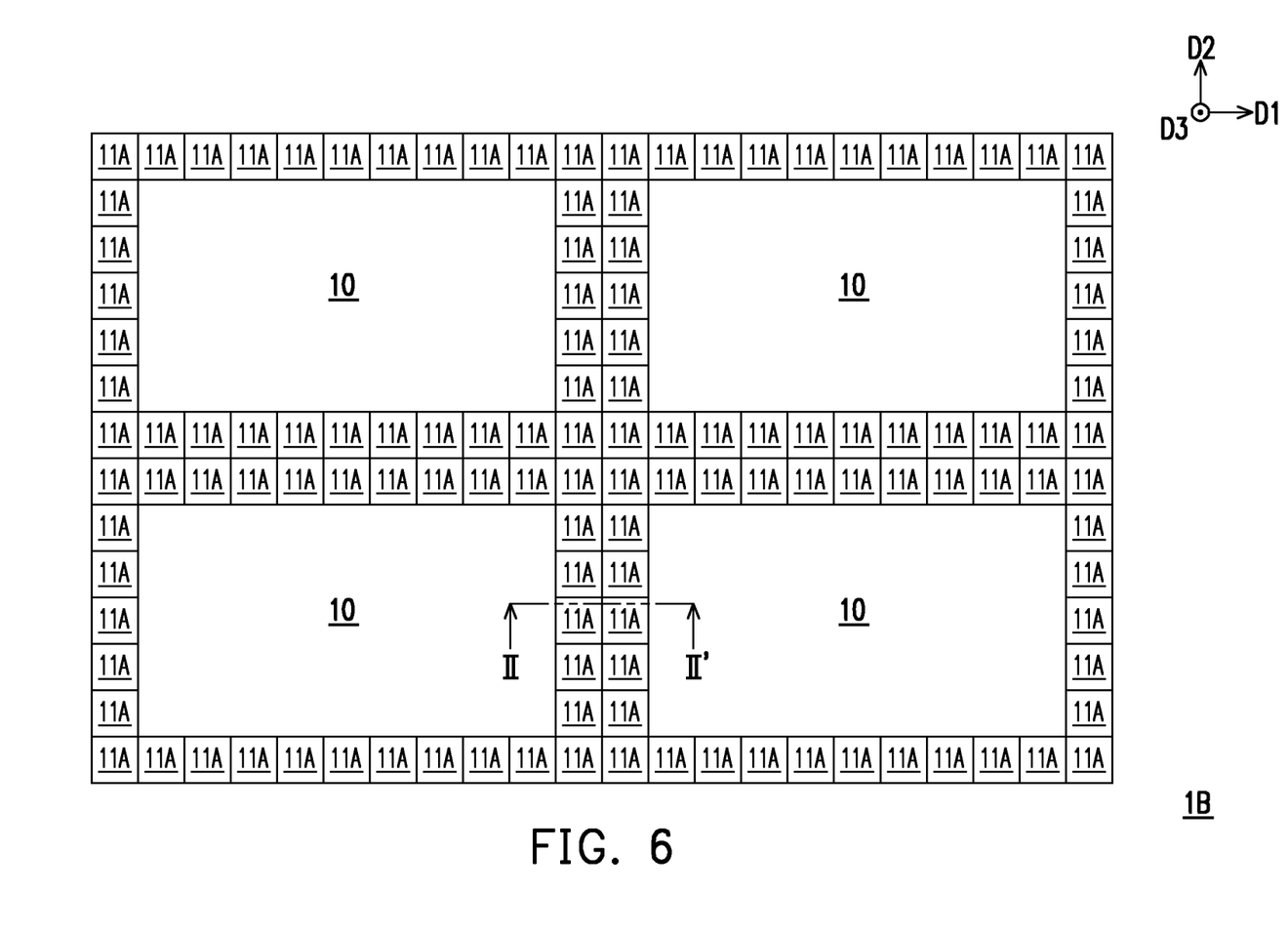
FIG. 6 is a schematic top view of a display device according to the third embodiment of the disclosure.
Figure 7:
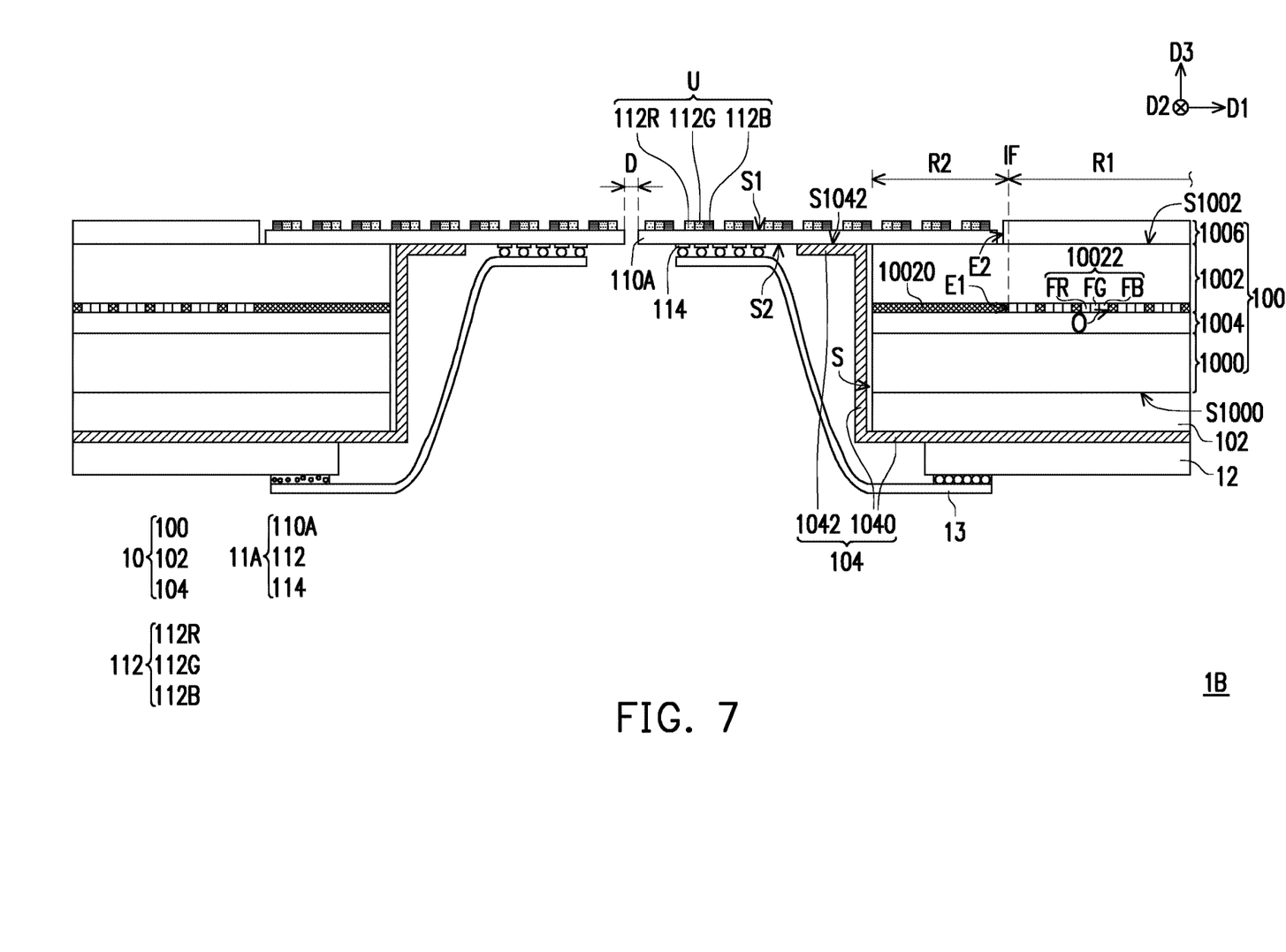
FIG. 7 is a schematic cross-sectional view along a line II-II' in FIG. 6.

FIG. 6 is a schematic top view of a display device 1B according to the third embodiment of the disclosure. FIG. 7 is a schematic cross-sectional view along a line II-II' in FIG. 6. Referring to FIG. 6 and FIG. 7, the main differences between the display device 1B and the display device 1A of FIG. 4 are described in the following. The display device 1B includes a plurality of liquid crystal displays 10. Specifically, the display device 1B is formed, for example, by tiling four display devices 1A of FIG. 4. Herein, the plurality of light-emitting diode boards 11A are located between the plurality of liquid crystal displays 10 and on peripheries of the plurality of liquid crystal displays 10. However, a relative configuration between the plurality of light-emitting diode boards 11A and the plurality of liquid crystal displays 10 is not limited thereto. For example, a plurality of light-emitting diode boards 11A may also be disposed only between two adjacent liquid crystal displays 10. In an embodiment, the plurality of light-emitting diode boards 11A may at least be disposed at peripheral portions 1042 between two adjacent liquid crystal displays 10 which are arranged along the first direction D1 or the second direction D2. In addition, the plurality of light-emitting diode boards 11A may be further disposed on one side or a plurality of sides of at least one liquid crystal display 10, for example, on the non-adjacent sides of two liquid crystal displays 10, but are not limited thereto.

By disposing the plurality of connecting pads 114 on a bottom surface (a second surface S2) of the carrier 110A, the flexible circuit board 13 bonded to the plurality of connecting pads 114 can extend from the bottom surface of the carrier 110A to the system board 12. The display device 1B includes a plurality of liquid crystal displays 10. A part of the plurality of light-emitting diode boards 11A are located between adjacent two liquid crystal displays 10. There is a distance D between adjacent two of the part of the light-emitting diode boards 11A, and the distance D may be greater than or equal to 0 mm, and less than or equal to 0.6 mm (0 mm≤D≤0.6 mm). Since the light-emitting diode board 11A which provides images is disposed in the peripheral region R2, which is the non-display region, and the distance D is smaller than a width of the peripheral region R2, a human eye can therefore sense there is a relatively narrow bezel near the junction place RR, which facilitates an improvement of a display quality of the display device 1B. The plurality of light-emitting diodes 112 and the color filter structures 10022 in the liquid crystal display module 100 may have the same kinds of colors and/or a manner of arrangement, which can further improve the display quality of the display device.

It should be noted that, in a configuration where a display device includes a plurality of liquid crystal displays and a plurality of light-emitting diode boards, a relative configuration between the plurality of liquid crystal displays and the plurality of light-emitting diode boards may be modified depending on requirements, and is not limited as shown in FIG. 6.

In summary of the foregoing, in the embodiments of the disclosure, by tiling the liquid crystal display and the plurality of light-emitting diode boards into the display device, the quantities of the light-emitting diodes and the circuit boards required can be reduced, which facilitates a reduction of the costs of the display device. By disposing the plurality of light-emitting diode boards in the peripheral region of the liquid crystal display to provide images, the bezel width near the junction place can be effectively reduced, and the display quality of the display device can be improved. In an embodiment, the design of the square carrier increases the degree of freedom of tiling, decreases the tiling difficulty, or improves the tiling efficiency when the light-emitting diode board and the liquid crystal display are tiled. By disposing the plurality of connecting pads on the bottom surface (the second surface) of the carrier to be electrically connected to the flexible circuit board, the flexible circuit board does not need to be electrically connected to the top surface of the carrier through the side surface of the carrier, which can reduce a width of the bezel. Therefore, in an embodiment, when the plurality of light-emitting diode boards are disposed between two adjacent liquid crystal displays, the distance between two adjacent light-emitting diode boards can be effectively reduced, which facilitates the improvement of the display quality of the display device.

The foregoing embodiments are only used to illustrate, instead of limiting, the technical solutions of the disclosure. Although the disclosure has been described in detail with reference to the foregoing embodiments, people having ordinary skill in the art should understand that the technical solutions described in the foregoing embodiments may still be modified, or that some or all technical features therein may be equivalently replaced. However, the nature of the corresponding technical solutions so modified or replaced does not depart from the scope of the technical solutions of the embodiments of the disclosure.

Although the embodiments and the advantages thereof have been disclosed as above, it should be understood that, people having ordinary skill in the art may make combinations, variations, replacements, and modifications without departing from the spirit and scope of the disclosure. In addition, the protection scope of the disclosure is not limited to a process, machine, manufacturing, material composition, device, method, and step in a specific embodiment in this specification. People having ordinary skill in the art may understand that the existing or to-be-developed process, machine, manufacturing, material composition, device, method, and step from the content of the disclosure may be used according to the disclosure as long as the substantially same function can be implemented or the substantially same result can be obtained in the embodiments described herein. Therefore, the protection scope of the disclosure includes the foregoing process, machine, manufacturing, material composition, device, method, and step. In addition, each claim forms an independent embodiment, and the protection scope of the disclosure also includes a combination of claims and embodiments. The protection scope of the disclosure should be subject to the appended claims.

What is claimed is:

1. A display device comprising:
   a liquid crystal display comprising a peripheral region;
   a plurality of light-emitting diode boards disposed adjacent to the liquid crystal display, and overlapping the peripheral region of the liquid crystal display in a normal direction of the display device, at least one of the plurality of light-emitting diode boards comprising:
      a carrier having a first surface and a second surface, wherein the second surface is opposite to the first surface, and the second surface is located between the first surface and the liquid crystal display;
      a plurality of light-emitting diodes disposed on the first surface; and
      a plurality of connecting pads disposed on the second surface and electrically connected to the plurality of light-emitting diodes;
   a system board located below the liquid crystal display and electrically connected to the liquid crystal display; and
   a flexible circuit board disposed on the second surface of the carrier, wherein the flexible circuit board and the carrier are located respectively on two opposite sides of the plurality of connecting pads, and the system board is electrically connected to the plurality of connecting pads through the flexible circuit board.

2. The display device according to claim 1, wherein the liquid crystal display comprises a liquid crystal display module, a light source module, and a backplane, and the light source module is located between the liquid crystal display module and the backplane.

3. The display device according to claim 2, wherein the plurality of connecting pads do not overlap the liquid crystal display module in the normal direction of the display device.

4. The display device according to claim 2, wherein the liquid crystal display module comprises an upper polarizing plate, and the carrier is disposed adjacent to the upper polarizing plate.

5. The display device according to claim 2, wherein the plurality of connecting pads do not overlap the backplane in the normal direction of the display device.

6. The display device according to claim 2, wherein the backplane has a central portion and a peripheral portion connected to the central portion, a space is formed in the central portion, and the liquid crystal display module and the light source module are disposed in the space.

7. The display device according to claim 6, wherein the carrier is disposed corresponding to the liquid crystal display module and the peripheral portion, and the carrier contacts the liquid crystal display module.

8. The display device according to claim 6, wherein the carrier is disposed corresponding to the liquid crystal display module and the peripheral portion, and the carrier contacts the peripheral portion of the backplane.

9. The display device according to claim 2, wherein the liquid crystal display module comprises an active element array substrate, an opposite substrate, and a liquid crystal layer located between the active element array substrate and the opposite substrate.

10. The display device according to claim 9, wherein the liquid crystal display further comprises an active region, the opposite substrate comprises a plurality of color filter structures disposed in the active region, and the peripheral region is located on a periphery of the active region.

11. The display device according to claim 10, wherein the plurality of light-emitting diodes and the plurality of color filter structures have same kinds of colors.

12. The display device according to claim 10, wherein the plurality of light-emitting diodes and the plurality of color filter structures have a same manner of arrangement.

13. The display device according to claim 10, wherein the opposite substrate comprises a light shielding structure.

14. The display device according to claim 13, wherein the light shielding structure comprises an opaque material, a light-absorbing material, or a light-reflecting material.

15. The display device according to claim 9, wherein a plurality of color filter structures are formed on the active element array substrate.

16. The display device according to claim 1, wherein the plurality of connecting pads are electrically connected to the flexible circuit board by using a surface-mount technology.

17. The display device according to claim 1, wherein the plurality of light-emitting diodes of the at least one of the plurality of light-emitting diode boards are arranged in an $m*n$ array, and m or n is a common factor of a resolution of the liquid crystal display.

18. The display device according to claim 17, wherein m is greater than or equal to 20 and less than or equal to 120.

19. The display device according to claim 17, wherein n is greater than or equal to 20 and less than or equal to 120.

20. The display device according to claim 1, further comprising a plurality of liquid crystal displays, wherein a part of the plurality of light-emitting diode boards are located between adjacent two of the plurality of liquid crystal displays, and a distance between adjacent two of the part of the plurality of light-emitting diode boards is greater than or equal to 0 mm and less than or equal to 0.6 mm.

* * * * *